United States Patent
Minemura

(10) Patent No.: US 11,658,015 B2
(45) Date of Patent: May 23, 2023

(54) CERAMIC STRUCTURE, ELECTROSTATIC CHUCK AND SUBSTRATE FIXING DEVICE

(71) Applicant: SHINKO ELECTRIC INDUSTRIES CO., LTD., Nagano (JP)

(72) Inventor: Tomotake Minemura, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 193 days.

(21) Appl. No.: 17/365,182

(22) Filed: Jul. 1, 2021

(65) Prior Publication Data

US 2022/0013341 A1    Jan. 13, 2022

(30) Foreign Application Priority Data

Jul. 7, 2020   (JP) .............................. JP2020-117316

(51) Int. Cl.
*H01L 21/683* (2006.01)
*H01J 37/32* (2006.01)
*C04B 37/02* (2006.01)

(52) U.S. Cl.
CPC ...... *H01J 37/32724* (2013.01); *C04B 37/023* (2013.01); *H01L 21/6833* (2013.01); *H10N 10/17* (2023.02); *C04B 2237/062* (2013.01); *C04B 2237/343* (2013.01); *C04B 2237/403* (2013.01); *C04B 2237/404* (2013.01); *H01J 2237/002* (2013.01); *H01J 2237/2007* (2013.01)

(58) Field of Classification Search
CPC . H01J 37/32724; H01L 21/6833; H01N 10/17
See application file for complete search history.

(56) References Cited

U.S. PATENT DOCUMENTS

| | | | |
|---|---|---|---|
| 2016/0245790 A1* | 8/2016 | Kawai | G01N 33/48721 |
| 2018/0122659 A1* | 5/2018 | Tsuchida | H01L 21/67248 |
| 2020/0370965 A1* | 11/2020 | Beckman | G21D 7/04 |
| 2021/0285826 A1* | 9/2021 | Katogi | G01K 7/028 |
| 2022/0381093 A1* | 12/2022 | Ghosh | E21B 10/52 |

FOREIGN PATENT DOCUMENTS

| | | | |
|---|---|---|---|
| JP | 2000233978 A | * | 8/2000 |
| JP | 2000-286331 | | 10/2000 |

* cited by examiner

*Primary Examiner* — Scott Bauer
(74) *Attorney, Agent, or Firm* — Rankin, Hill & Clark LLP

(57) ABSTRACT

A ceramic structure includes a base body, and a thermoelectric device having a part in directly contact with the base body. The base body is a ceramic consisting of aluminum oxide. The thermoelectric device comprises a conductor part that is a sintered body having an alloy of tungsten and rhenium, as a main component, and including nickel oxide, aluminum oxide and silicon dioxide.

15 Claims, 16 Drawing Sheets

CERAMIC STRUCTURE, ELECTROSTATIC CHUCK AND SUBSTRATE FIXING DEVICE

CROSS-REFERENCE TO RELATED APPLICATIONS

This application is based on and claims the benefit of priority from prior Japanese patent application No. 2020-117316 filed on Jul. 7, 2020, the entire contents of which are incorporated herein by reference.

TECHNICAL FIELD

The present invention relates to a ceramic structure, an electrostatic chuck, and a substrate fixing device.

BACKGROUND ART

In the related art, a film formation apparatus and a plasma etching apparatus that are used when manufacturing a semiconductor device each have a stage for holding accurately a wafer in a vacuum treatment chamber. As the stage, for example, a substrate fixing device configured to suck and hold a wafer by an electrostatic chuck mounted on a base plate is suggested.

There is an electrostatic chuck having a structure where a heat-generating element for temperature regulation of a wafer is provided. In this case, for example, a thermocouple is embedded in the electrostatic chuck, and the heat-generating element is controlled based on a temperature of the electrostatic chuck detected by the thermocouple, so that temperature regulation of the wafer is performed (for example, refer to PTL 1).

CITATION LIST

Patent Literature

[PTL 1] JP-A-2000-286331

However, in many cases, a sintering additive (for example, silica, magnesia, calcia, yttria and the like) is generally included in alumina ceramic. In the ceramic including the sintering additive, a value of an insulation resistance is likely to decrease as the temperature of the using environment rises. Therefore, alumina ceramic that does not include a sintering additive and has an insulation resistance having small temperature dependency is needed. However, since there is no sintering additive that becomes a liquid phase during sintering, adhesiveness (join strength) between a ceramic, which constitutes a base body, and a thermoelectric device such as a thermocouple may not be obtained, in a ceramic structure such as an electrostatic chuck.

SUMMARY OF INVENTION

Aspect of non-limiting embodiments of the present disclosure is to provide a ceramic structure where adhesiveness between a ceramic and a thermoelectric device is improved.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a ceramic structure comprising:

a base body; and a thermoelectric device having a part in directly contact with the base body, wherein the base body is a ceramic consisting of aluminum oxide, and wherein the thermoelectric device comprises a conductor part that is a sintered body having an alloy of tungsten and rhenium, as a main component, and including nickel oxide, aluminum oxide and silicon dioxide.

According to the disclosed technology, it is possible to provide the ceramic structure where adhesiveness between the ceramic and the thermoelectric device is improved.

BRIEF DESCRIPTION OF DRAWINGS

Exemplary embodiment(s) of the present invention will be described in detail based on the following figures, wherein.

DESCRIPTION OF EMBODIMENTS

Hereinafter, embodiments of the present invention will be described with reference to the drawings. In the respective drawings, the same constitutional parts are denoted with the same reference signs, and overlapping descriptions may be omitted.

First Embodiment

[Structure of Substrate Fixing Device]

Figure 1A:
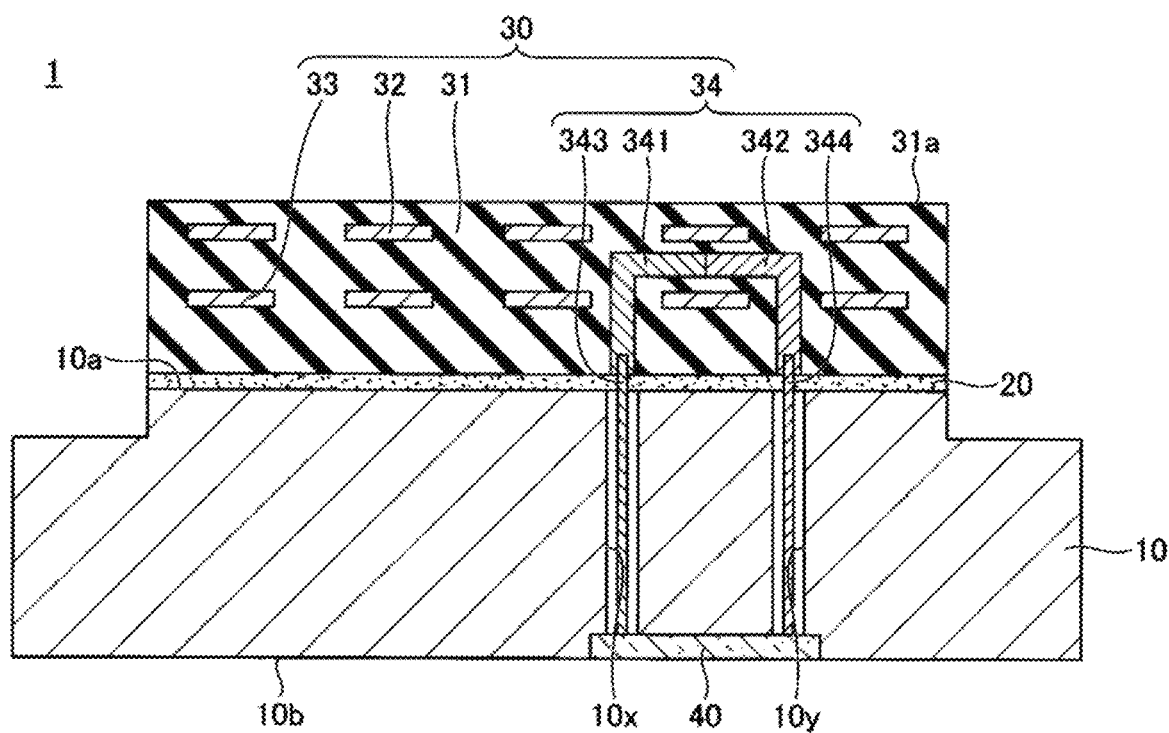
FIGS. 1A and 1B are simplified views showing a substrate fixing device according to a first embodiment.
Figure 1B:
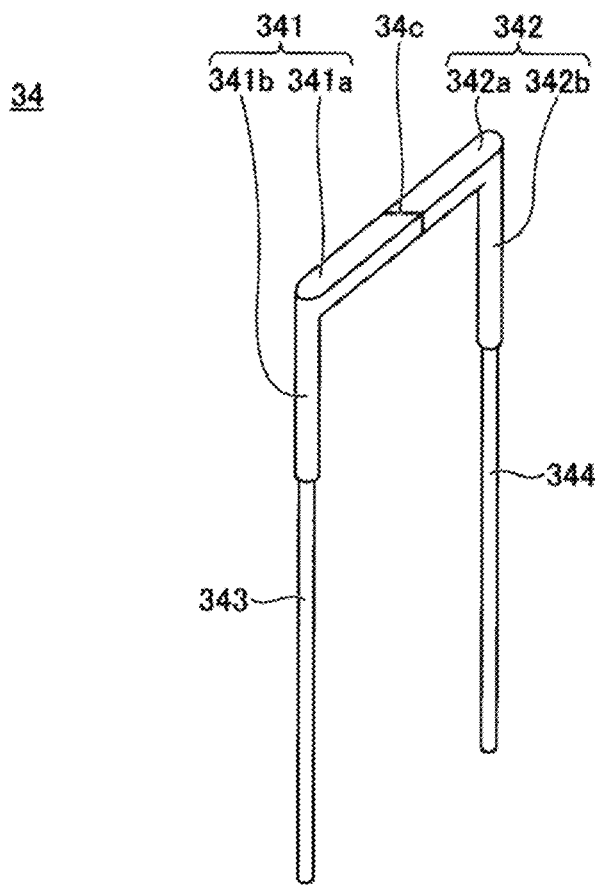

FIG. 1A is a simplified view showing a substrate fixing device according to a first embodiment, where FIG. 1A is a sectional view and FIG. 1B is a partially enlarged view showing only a thermocouple.

Referring to FIG. 1A, a substrate fixing device 1 includes, as main constitutional elements, a base plate 10, an adhesion layer 20, an electrostatic chuck 30, and a control unit 40. The substrate fixing device 1 is a device configured to suck and hold a substrate (a wafer and the like), which is a suction target, by the electrostatic chuck 30 mounted on one surface 10*a* of the base plate 10.

The base plate 10 is a member for mounting the electrostatic chuck 30. A thickness of the base plate 10 is, for example, about 20 mm to 40 mm. The base plate 10 is formed of, for example, a metal material such as aluminum and cemented carbide alloy, a composite material of the metal material and a ceramic material, or the like, and can be used as an electrode for controlling plasma. For example, from standpoints of easy availability, easy processing, good thermal conductivity and the like, a base plate where aluminum or an alloy thereof is used and an alumite treatment (insulation layer formation) is performed on a surface thereof can be favorably used.

For example, by supplying predetermined high-frequency electric power to the base plate 10, it is possible to control energy for causing ions in a generated plasma state to collide with the substrate sucked on the electrostatic chuck 30, and to effectively perform an etching treatment.

In the base plate 10, a gas supply path for introducing an inert gas for cooling the substrate sucked on the electrostatic chuck 30 may be provided. When the inert gas such as He and Ar is introduced into the gas supply path from an outside of the substrate fixing device 1 and the inert gas is supplied to a backside of the substrate sucked on the electrostatic chuck 30, the substrate can be cooled.

In the base plate 10, a coolant flow path may be provided. The coolant flow path is an annular hole formed in the base plate 10, for example. For example, a coolant such as cooling water and GALDEN is introduced from the outside of the substrate fixing device 1 into the coolant flow path. The coolant is circulated in the coolant flow path to cool the base plate 10, thereby cooling the substrate sucked on the electrostatic chuck 30.

The electrostatic chuck 30 is a ceramic structure configured to suck and hold the substrate that is a suction target. A planar shape of the electrostatic chuck 30 is formed according to a shape of the substrate, and is for example, circular. A diameter of the substrate that is a suction target of the electrostatic chuck 30 is, for example, 8 inches, 12 inches, or 18 inches.

Note that, the description "as seen from above" refers to seeing a target in a normal direction of one surface 10a of the base plate 10, and the planar shape refers to a shape seen in the normal direction of one surface 10a of the base plate 10.

The electrostatic chuck 30 is fixed on the base plate 10 via the adhesion layer 20. As the adhesion layer 20, for example, a silicon-based adhesive may be used. A thickness of the adhesion layer 20 may be, for example, about 0.1 mm to 2.0 mm. A thermal conductivity of the adhesion layer 20 is preferably equal to or greater than 2 W/mK. The adhesion layer 20 may be formed as one layer but is preferably formed to have a two-layered structure where an adhesive having a high thermal conductivity and an adhesive having a low elastic modulus are combined. Thereby, an effect of reducing stress that is generated due to a difference in thermal expansion coefficient between the ceramic electrostatic chuck 30 and the aluminum base plate 10 is obtained. Note that, the electrostatic chuck 30 may also be fixed to the base plate 10 by a screw.

The electrostatic chuck 30 is a ceramic structure having a base body 31, an electrostatic electrode 32, a heat-generating element 33, and a thermocouple 34, as main constitutional elements. An upper surface of the base body 31 is a placement surface 31a on which a suction target is placed. The electrostatic chuck 30 is, for example, a Johnson-Rahbek type electrostatic chuck. However, the electrostatic chuck 30 may also be a Coulomb force type electrostatic chuck.

The base body 31 is a dielectric body. Specifically, the base body 31 is a ceramic consisting of aluminum oxide ($Al_2O_3$). As used herein, the "ceramic consisting of aluminum oxide" means a ceramic in which inorganic components except aluminum oxide are not added. A thickness of the base body 31 is, for example, about 5 mm to 10 mm, and a specific permittivity (1 kHz) of the base body 31 is, for example, about 9 to 10.

The base body 31 preferably has an aluminum oxide purity of 99.5% or higher. The purity of 99.5% or higher indicates that a sintering additive is not added. Further, the purity of 99.5% or higher means that unintended impurities may be included during a manufacturing process and the like. The base body 31 preferably has a relative density of 97% or greater with respect to aluminum oxide. The base body 31 preferably has an average particle diameter of aluminum oxide of 1.0 μm or greater and 3.0 μm or smaller. The average particle diameter can be measured using a laser diffraction/scattered light device, for example.

The electrostatic electrode 32 is a thin film electrode, and is embedded in the base body 31. The electrostatic electrode 32 is connected to a power supply provided outside the substrate fixing device 1, and is configured to apply a predetermined voltage from the power supply, thereby generating a suction force (Coulomb's force) by static electricity between the electrostatic electrode and a suction target. Thereby, the substrate can be sucked and held on the placement surface 31a of the base body 31. The suction holding force becomes stronger as the voltage applied to the electrostatic electrode 32 is higher. The electrostatic electrode 32 may have a unipolar shape or a bipolar shape. A material of the electrostatic electrode 32 is preferably a sintered body having tungsten (W) as a main component and including nickel oxide (NiO), aluminum oxide ($Al_2O_3$) and silicon dioxide ($SiO_2$).

The heat-generating element 33 is embedded in the base body 31 and is electrically connected to the control unit 40 by a wiring (not shown). The heat-generating element 33 is configured to generate heat as a voltage is applied thereto from the control unit 40, thereby heating the placement surface 31a of the base body 31 to a predetermined temperature. The heat-generating element 33 can heat the placement surface 31a of the base body 31 to about 250° C. to 300° C., for example. As a material of the heat-generating element 33, for example, copper (Cu), tungsten (W), nickel (Ni) and the like can be used.

The thermocouple 34 is a thermoelectric device configured to detect a temperature of the base body 31, and is at least partially embedded in the base body 31. Specifically, the thermocouple 34 has a portion that is in contact with the base body 31. The thermocouple 34 has a first conductor part 341, a second conductor part 342, a first wire part 343, and a second wire part 344. The first conductor part 341 and the second conductor part 342 each have a substantial L-shape, and are embedded in the base body 31. The first conductor part 341 and the second conductor part 342 are covered by the base body 31. One end of the first conductor part 341 and one end of the second conductor part 342 are bonded to each other to form a temperature measurement contact point 34c.

The first conductor part 341 has a first horizontal portion 341a extending in a direction parallel to the placement surface 31a and having one end that is the temperature measurement contact point 34c, and a first vertical portion 341b extending from the other end of the first horizontal portion 341a in a direction perpendicular to the placement surface 31a and having an end portion exposed from the base body 31. The first horizontal portion 341a and the first vertical portion 341b are integrally formed by the same material. A sectional shape of the first vertical portion 341b is, for example, circular. In this case, a diameter of the first vertical portion 341b may be formed greater than a width of the first horizontal portion 341a.

The second conductor part 342 has a second horizontal portion 342a extending in a direction parallel to the placement surface 31a and having one end that is the temperature measurement contact point 34c, and a second vertical portion 342b extending from the other end of the second horizontal portion 342a in a direction perpendicular to the placement surface 31a and having an end portion exposed from the base body 31. The second horizontal portion 342a and the second vertical portion 342b are integrally formed by the same material. A sectional shape of the second vertical portion 342b is, for example, circular. In this case, a diameter of the second vertical portion 342b may be formed greater than a width of the second horizontal portion 342a.

In FIG. 1B, the first horizontal portion 341a and the second horizontal portion 342a are bonded to be linear, as seen in the normal direction of the placement surface 31a. However, this is just an example. The first horizontal portion 341a and the second horizontal portion 342a may be bonded to have an arbitrary angle, as seen in the normal direction of the placement surface 31a. Further, the first horizontal portion 341a and the second horizontal portion 342a may each have a bent or curved portion, as seen in the normal direction of the placement surface 31a.

The first horizontal portion 341a and the second horizontal portion 342a can be arranged in positions (a different plane in the base body 31) different from the electrostatic electrode 32 and the heat-generating element 33 in a thickness direction of the base body 31, for example.

Note that, as used herein, "parallel to the placement surface 31a" and "perpendicular to the placement surface 31a" include not only a case "strictly parallel to the placement surface 31a" and "strictly parallel to the placement surface 31a" but also a case "substantially parallel to the placement surface 31a" and "substantially parallel to the placement surface 31a". The case "substantially parallel to the placement surface 31a" includes a case of a deviation of about 10° from the case "strictly parallel to the placement surface 31a". Similarly, the case "substantially perpendicular to the placement surface 31a" includes a case of a deviation of about ±10° from the case "strictly perpendicular to the placement surface 31a".

The first wire part 343 has one end bonded to the other end of the first conductor part 341 (the end portion of the first vertical portion 341b) in the base body 31, and the other end extending to an outside of the base body 31. The first wire part 343 extending to the outside of the base body 31 is inserted into a through-hole 10x formed in the base plate 10 through the adhesion layer 20, so that the other end is electrically connected to the control unit 40 arranged on the other surface 10b-side of the base plate 10. Note that, an insulating material is preferably arranged between an inner wall of the through-hole 10x and the first wire part 343.

The second wire part 344 has one end bonded to the other end of the second conductor part 342 (the end portion of the second vertical portion 342b) in the base body 31, and the other end extending to an outside of the base body 31. The second wire part 344 extending to the outside of the base body 31 is inserted into a through-hole 10y formed in the base plate 10 through the adhesion layer 20, so that the other end is electrically connected to the control unit 40 arranged on the other surface 10b-side of the base plate 10. Note that, an insulating material is preferably arranged between an inner wall of the through-hole 10y and the second wire part 344.

The first conductor part 341 is formed of a material having a predetermined resistance temperature coefficient. The second conductor part 342 is also formed of a material having a resistance temperature coefficient different from the first conductor part 341. Thereby, the thermocouple 34 can generate a thermal electromotive force by a temperature difference between the temperature measurement contact point 34c, which is a connection part between the first conductor part 341 and the second conductor part 342, and the other end of the first conductor part 341 and the other end of the second conductor part 342. As materials of the first wire part 343 and the second wire part 344, copper and the like can be used, for example.

The materials of the first conductor part 341 and the second conductor part 342 are preferably conductive materials each having a melting point higher than a sintering temperature (about 1500° C.) of the base body 31. Thereby, the first conductor part 341 and the second conductor part 342 can be co-sintered with the base body 31. As the conductive material having a melting point higher than the sintering temperature of the base body 31, following materials can be exemplified.

The first conductor part 341 is a sintered body having an alloy (Re: 5 wt %) of tungsten (W) and rhenium (Re), as a main component, and including nickel oxide (NiO), aluminum oxide ($Al_2O_3$) and silicon dioxide ($SiO_2$). The second conductor part 342 is a sintered body having an alloy (Re: 26 wt %) of tungsten (W) and rhenium (Re), as a main component, and including nickel oxide (NiO), aluminum oxide ($Al_2O_3$) and silicon dioxide ($SiO_2$).

In each of the first conductor part 341 and the second conductor part 342, an average particle diameter of tungsten is preferably equal to or greater than 0.5 μm and equal to or smaller than 3.0 μm. An average particle diameter of rhenium is preferably equal to or greater than 1.5 μm and equal to or smaller than 4.5 μm.

An addition amount of nickel oxide is preferably equal to or more than 0.2 wt % and equal to or less than 1.0 wt % with respect to tungsten. An average particle diameter of nickel oxide is preferably equal to or greater than 5.0 μm and equal to or smaller than 15.0 μm.

An addition amount of aluminum oxide is preferably equal to or more than 0.2 wt % and equal to or less than 3.0 wt % with respect to tungsten. An average particle diameter of aluminum oxide is preferably equal to or greater than 0.1 μm and equal to or smaller than 4.0 μm.

An addition amount of silicon dioxide is preferably equal to or more than 0.2 wt % and equal to or less than 3.0 wt % with respect to tungsten. An average particle diameter of silicon dioxide is preferably equal to or greater than 0.1 μm and equal to or smaller than 12.0 μm.

The component of tungsten included in each of the first conductor part 341 and the second conductor part 342 is present only in the first conductor part 341 and the second conductor part 342 and is not present in the base body 31. In addition, the component of rhenium included in each of the first conductor part 341 and the second conductor part 342 is present only in the first conductor part 341 and the second conductor part 342 and is not present in the base body 31. Further, the component of nickel included in each of the first conductor part 341 and the second conductor part 342 is present only in the first conductor part 341 and the second conductor part 342 and is not present in the base body 31.

In contrast, the component of aluminum included in each of the first conductor part 341 and the second conductor part 342 is present both in the first conductor part 341 and the second conductor part 342 and in the base body 31. In addition, the component of silicon included in each of the first conductor part 341 and the second conductor part 342 is present both in the first conductor part 341 and the second conductor part 342 and in the base body 31.

Particularly, in the ceramic constituting the base body 31, the component of silicon is present only within a range of 20 µm from a boundary between the ceramic constituting the base body 31 and the first conductor part 341 and second conductor part 342 constituting the thermocouple. In the range, a composite oxide layer of aluminum and silicon (a mullite layer, a sillimanite layer or a mixed layer of a mullite layer and a sillimanite layer) is formed. For this reason, since the component of silicon does not diffuse beyond the composite oxide layer, a concern that characteristics of the ceramic constituting the base body 31 will be deteriorated can be reduced. Note that, the range of the composite oxide layer can be varied by addition amounts of alumina and silica that are added to the conductive paste.

Note that, FIG. 1A shows an example where the substrate fixing device 1 has one thermocouple 34. However, the substrate fixing device 1 may have a plurality of thermocouples 34. Thereby, it is possible to accurately perform temperature control of the base body 31. In this case, the thermocouples 34 may be arranged in different positions in the thickness direction of the base body 31.

The control unit 40 has functions of calculating a temperature of the base body 31 based on the thermal electromotive force obtained from the thermocouple 34 and controlling a voltage to be applied to the heat-generating element 33 to adjust the placement surface 31a of the base body 31 to a predetermined temperature. The control unit 40 may include, for example, a CPU (Central Processing Unit), a ROM (Read Only Memory), a RAM (Random Access Memory) and the like. The control unit 40 may be mounted on the substrate and fixed to the base plate 10, for example.

[Manufacturing Method of Substrate Fixing Device]

FIGS. 2A to 3C exemplify a manufacturing process of the substrate fixing device according to the first embodiment. The manufacturing process of the substrate fixing device 1 is described with reference to FIGS. 2A to 3C.

Figure 2A:
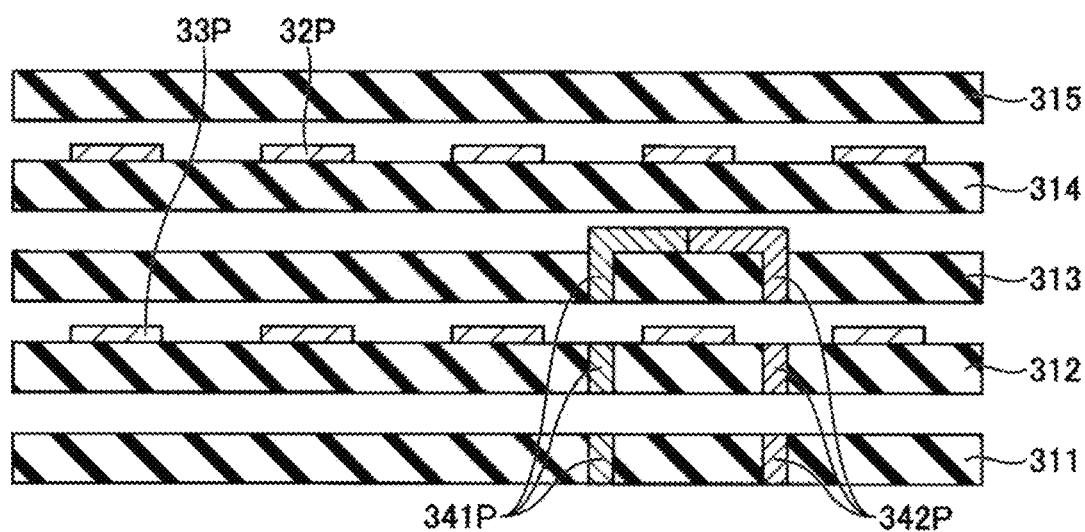
FIGS. 2A to 2C are views showing a manufacturing process of the substrate fixing device according to the first embodiment.

First, in a process shown in FIG. 2A, a plurality of (here, five, for example) green sheets 311, 312, 313, 314 and 315 is manufactured. Portions of the green sheets 311, 312 and 313, in which the thermocouple 34 is to be formed, are formed with through-holes. Note that, the through-holes that are formed in the green sheets 311, 312 and 313 may be formed to have a diameter of about 50 to 300 µm after sintering, for example.

Note that, the green sheets 311, 312, 313, 314 and 315 are each made of aluminum oxide, which is a ceramic material, and an organic material, and do not include a sintering additive. The green sheets 311, 312, 313, 314 and 315 are formed into the base body 31 shown in FIG. 1A by removing the organic component, and sintering and densifying the ceramic material.

Subsequently, one surface of the green sheet 312 is formed with a metal paste 33P, which is to be the heat-generating element 33 after sintering, and one surface of the green sheet 314 is formed with a metal paste 32P, which is to be the electrostatic electrode 32 after sintering, so as to be a pattern shown in FIG. 1A. Further, in the through-holes of the green sheet 311 and 312, and one surface and in the through-hole of the green sheet 313 are formed with metal pastes 341P and 342P, which are to be the first conductor part 341 and the second conductor part 342 after sintering, so as to be the pattern shown in FIG. 1A.

The metal paste 341P is a material that has an alloy (Re. 5 wt %) of tungsten (W) and rhenium (Re), as a main component, and includes nickel oxide (NiO), aluminum oxide ($Al_2O_3$), silicon dioxide ($SiO_2$) and an organic material mixed, for example. The metal paste 342P is a material that has an alloy (Re: 26 wt %) of tungsten (W) and rhenium (Re), as a main component, and includes nickel oxide (NiO), aluminum oxide ($Al_2O_3$), silicon dioxide ($SiO_2$) and an organic material mixed, for example.

In each of the metal pastes 341P and 342P, the addition amount of nickel oxide is preferably equal to or more than 0.2 wt % and equal to or less than 1.0 wt % with respect to tungsten. Nickel oxide is preferably added by 0.2 wt % or more so as to improve the sinterability of tungsten and rhenium. Note that, when nickel oxide is added more than 1.0 wt %, crystals of tungsten become excessively large, so that sufficient adhesion with the base body 31 is not obtained. When co-sintering the conductive paste and the green sheet, the average particle diameter of tungsten is preferably equal to or greater than 0.5 µm and equal to or smaller than 3.0 µm. Similarly, the average particle diameter of nickel oxide is preferably equal to or greater than 5.0 µm and equal to or smaller than 15.0 µm.

The addition amount of aluminum oxide is preferably equal to or more than 0.2 wt % and equal to or less than 3.0 wt % with respect to tungsten. Aluminum oxide is preferably added by 0.2 wt % or more so as to improve the adhesiveness between the thermocouple 34 and the base body 31 made of ceramic of aluminum oxide. Note that, when aluminum oxide is added more than 3.0 wt %, the sinterability is lowered and the specific resistance is increased. When co-sintering the conductive paste and the green sheet, the average particle diameter of aluminum oxide is preferably equal to or greater than 0.1 µm and equal to or smaller than 4.0 µm.

The addition amount of silicon dioxide is preferably equal to or more than 0.2 wt % and equal to or less than 3.0 wt % with respect to tungsten. Silicon dioxide is preferably added by 0.2 wt/o or more so as to be a liquid phase during sintering and to improve the sinterability of tungsten and rhenium and the adhesiveness with the base body 31. Note that, when silicon dioxide is added more than 3.0 wt %, the sinterability and the adhesiveness are lowered and the specific resistance is increased. When co-sintering the conductive paste and the green sheet, the average particle diameter of silicon dioxide is preferably equal to or greater than 0.1 µm and equal to or smaller than 12.0 µm.

The metal pastes 32P, 33P, 341P and 342P can be formed by a screen printing method, for example. Note that, the metal pastes 341P and 342P formed on one surface of the green sheet 313 may be formed so that a thickness after sintering is about 10 to 30 µm and a width after sintering is about 50 to 300 µm, for example.

Figure 2B:
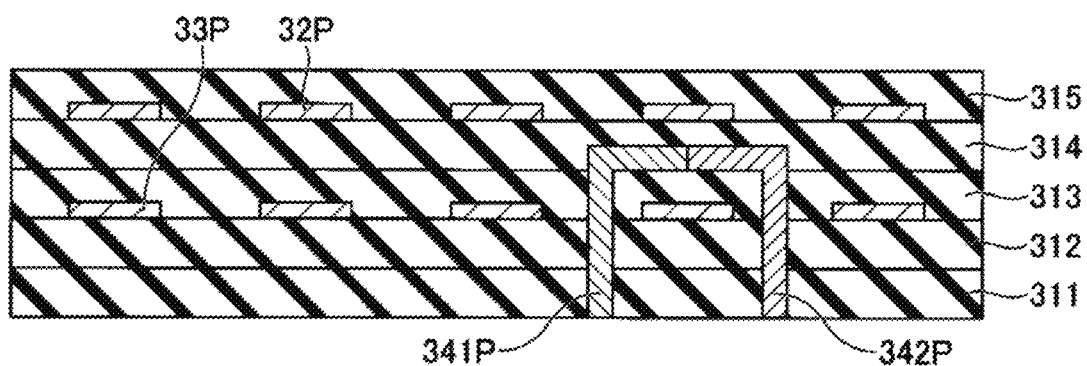

Subsequently, in a process shown in FIG. 2B, a stacked body where the green sheets 311, 312, 313, 314 and 315 manufactured in the process shown in FIG. 2A are sequentially stacked is manufactured.

Figure 2C:
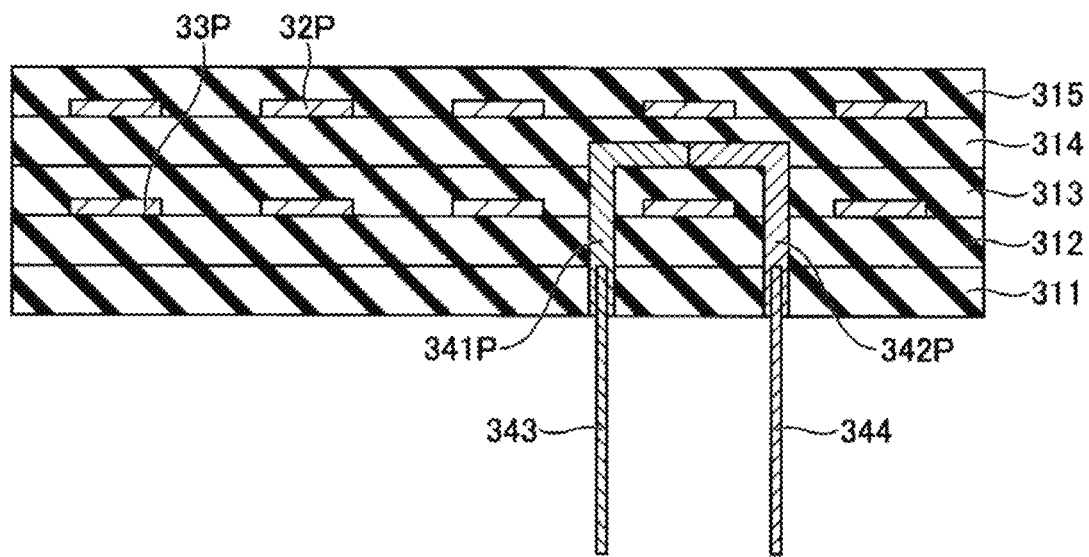

Then, in a process shown in FIG. 2C, the first wire part 343 and the second wire part 344 are prepared. Then, one end of the first wire part 343 is inserted into the metal paste 341P filled in the through-hole of the green sheet 311 of the stacked body shown in FIG. 2B, and one end of the second wire part 344 is inserted into the metal paste 342P filled in the through-hole of the green sheet 311. The wire diameters of the first wire part 343 and the second wire part 344 may be each formed to have about 50 to 300 µm, for example.

Figure 3A:
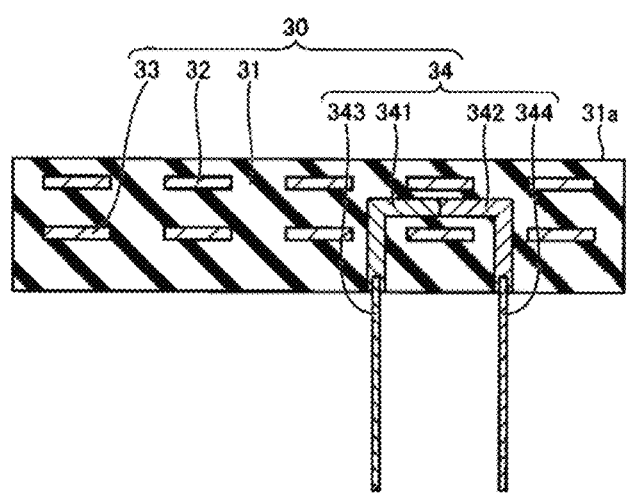
FIGS. 3A to 3C are views showing the manufacturing process of the substrate fixing device according to the first embodiment.

Subsequently, in a process shown in FIG. 3A, the stacked body shown in FIG. 2C is sintered to integrate the green sheets 311, 312, 313, 314 and 315, thereby forming the base body 31. Further, the electrostatic electrode 32, the heat-generating element 33, the first conductor part 341, and the second conductor part 342 are formed from the metal pastes 32P, 33P, 341P and 342P. In addition, the first conductor part 341 and the first wire part 343 are bonded to each other, and the second conductor part 342 and the second wire part 344 are bonded to each other. By the above processes, the electrostatic chuck 30 is completed. The sintering of the stacked body may be performed at normal pressures, for example. Note that, a volume of the electrostatic chuck 30 after sintering is reduced by several tens %, as compared to before sintering.

Figure 3B:
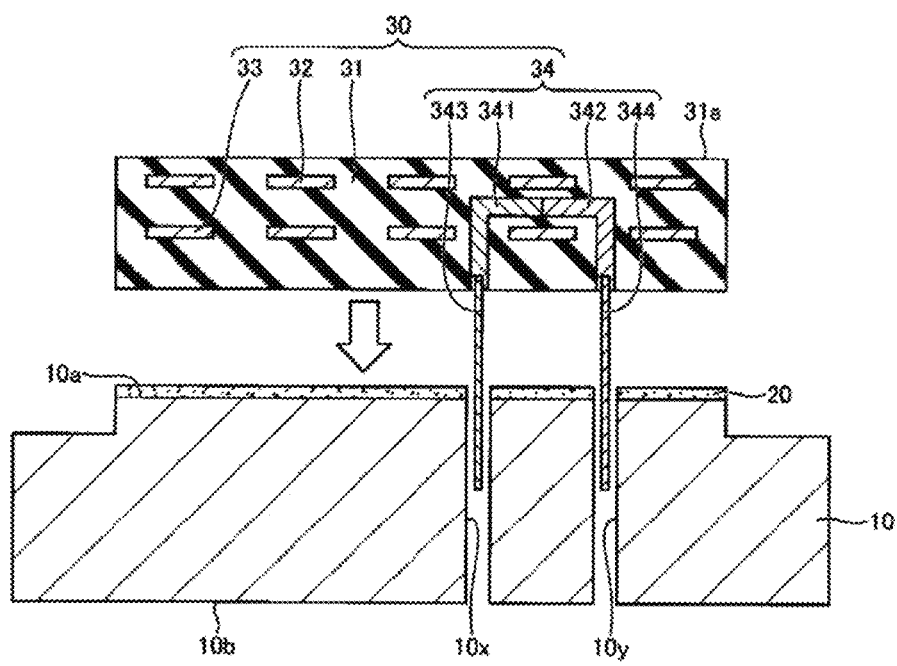

Subsequently, in a process shown in FIG. 3B, the base plate 10 in which the through-holes 10x and 10y are formed is prepared, and the adhesion layer 20 (not cured yet) is formed on one surface 10a of the base plate 10. Then, while inserting the first wire part 343 of the electrostatic chuck 30 completed in FIG. 3A into the through-hole 10x and the second wire part 344 into the through-hole 10y, the electrostatic chuck 30 is arranged on one surface 10a of the base plate 10 with the adhesion layer 20 being interposed therebetween, and the adhesion layer 20 is cured.

Figure 3C:
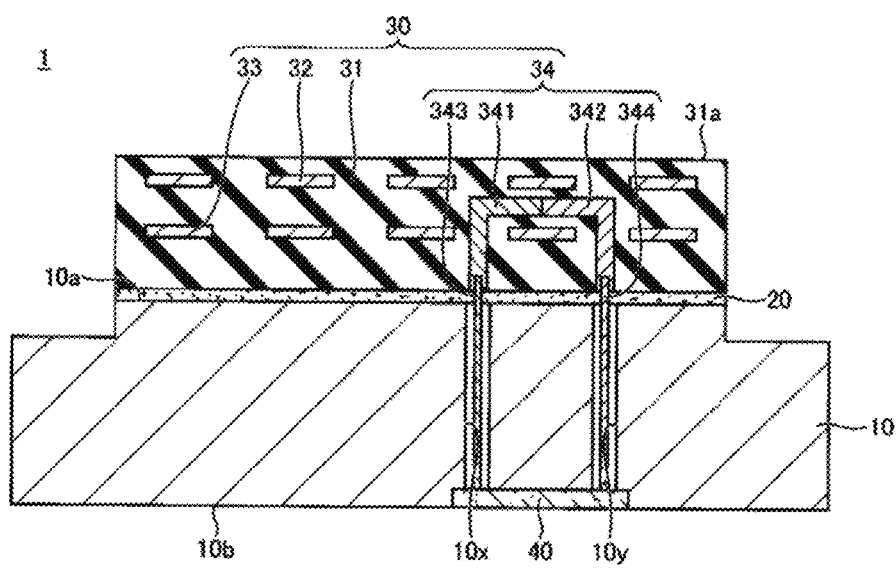

Subsequently, in a process shown in FIG. 3C, the control unit 40 mounted, for example, on the substrate (not shown) is fixed to the other surface 10b-side of the base plate 10. At this time, the other end of the first wire part 343 and the other end of the second wire part 344 are electrically connected to the control unit 40 by using soldering or the like. In this way, the substrate fixing device 1 where the electrostatic chuck 30 is mounted on one surface 10a of the base plate 10 with the adhesion layer 20 being interposed therebetween is completed.

As described above, in the electrostatic chuck 30 of the substrate fixing device 1, the base body 31 is ceramic made of aluminum oxide ($Al_2O_3$), and has the thermocouple 34. The first conductor part 341, which is one leg of the thermocouple 34, is a sintered body having an alloy (Re: 5 wt %) of tungsten (W) and rhenium (Re), as a main component. The second conductor part 342 that is the other leg is a sintered body having an alloy (Re: 26 wt %) of tungsten (W) and rhenium (Re), as a main component. Further, each leg of the thermocouple 34 includes nickel oxide (NiO), aluminum oxide ($Al_2O_3$) and silicon dioxide ($SiO_2$).

By adding nickel oxide to the conductive paste, which is to be each leg of the thermocouple 34, the sinterability of tungsten and rhenium in the conductor constituting the thermocouple 34 is improved without considerably lowering the electromotive force of the thermocouple 34. Note that, the higher the electromotive force is, the thermocouple can measure the temperature more accurately. The electromotive force is determined by a combination of materials. In the related art, it is concerned that when another component is mixed with a thermocouple having tungsten (W) and rhenium (Re), as main components, the electromotive force is lowered. Therefore, another component has not been added to a conductive paste that is to be the thermocouple. The present inventors newly found that even when nickel oxide and the like are added to tungsten and rhenium, the electromotive force of the thermocouple is not considerably lowered.

Further, when aluminum oxide and silicon dioxide are added to the conductive paste that is to be each leg of the thermocouple 34, the adhesiveness between the ceramic constituting the base body 31 and tungsten, i.e., the adhesiveness between the base body 31 and the thermocouple 34 is improved. Therefore, since it is not necessary to use a sintering additive, it is possible to reduce the concern that characteristics of the ceramic constituting the base body 31 will be deteriorated. Specifically, for example, when the sintering additive is included, the temperature dependency of the insulation resistance of the ceramic increases and the volume resistivity considerably decreases as the temperature of the use environment rises. However, the sintering additive is not used, so that it is possible to suppress the decrease in volume resistivity due to the temperature rising of the use environment.

Furthermore, the component of tungsten and the component of nickel oxide are not present in the ceramic constituting the base body 31 and are present only in each of the legs of the thermocouple 34. The component of aluminum oxide and the component of silicon dioxide are present both in the ceramic constituting the base body 31 and in each of the legs of the thermocouple 34. Specifically, in the ceramic constituting the base body 31, the component of silicon dioxide is present only within a range of 20 m from a boundary between the ceramic constituting the base body 31 and each of the legs of the thermocouple 34. In the range, a composite oxide layer of aluminum and silicon (a mullite layer, a sillimanite layer or a mixed layer of a mullite layer and a sillimanite layer) is formed. For this reason, since the Si component does not diffuse beyond the composite oxide layer, the concern that characteristics of the ceramic constituting the base body 31 will be deteriorated can be reduced. Note that, the range of the composite oxide layer can be varied by addition amounts of alumina and silica that are added to the conductive paste.

Further, the electrostatic electrode 32 is preferably a sintered body that has tungsten (W) as a main component and includes nickel oxide (NiO), aluminum oxide ($Al_2O_3$) and silicon dioxide ($SiO_2$).

By adding nickel oxide to the conductive paste that is to be the electrostatic electrode 32, the sinterability of tungsten in a conductive body constituting the electrostatic electrode 32 is improved. In addition, by adding aluminum oxide and silicon dioxide to the conductive paste that is to be the electrostatic electrode 32, the adhesiveness between the ceramic constituting the base body 31 and tungsten is improved. Therefore, since it is not necessary to use the sintering additive, the concern that characteristics of the ceramic constituting the base body 31 will be deteriorated can be reduced.

Further, the ceramic constituting the base body 31 preferably has an aluminum oxide purity of 99.5% or higher. Thereby, in the base body 31, the temperature dependency of the insulation resistance is lowered, and the decrease in insulation resistance due to the temperature rising can be suppressed.

Further, the ceramic constituting the base body 31 preferably has a relative density of 97% or greater with respect to aluminum oxide. Such base body 31 has few pores on a surface and an inside thereof. The pores affect suction of the base body 31. Therefore, the base body 31 having a high relative density is preferable in terms of characteristics as the substrate fixing device 1.

Further, according to the substrate fixing device 1, since the base body 31 and the thermocouple 34 of the electrostatic chuck 30 are formed by the co-sintering, the manufacturing process can be simplified. The co-sintering can be performed under atmospheric pressures.

Further, according to the substrate fixing device 1, the first conductor part 341 and the first wire part 343, and the second conductor part 342 and the second wire part 344 are directly bonded by the co-sintering with the base body 31. Therefore, unlike the substrate fixing device of the related art, it is not necessary to use pads for bonding, so that the thermocouples 34 can be arranged at high density in the base body 31. In addition, as compared to a well-known substrate fixing device having a structure where the base body is provided with grooves and commercially available thermocouples are inserted in the grooves, the thermocouples 34 can be arranged at high density in the base body 31.

Further, according to the substrate fixing device 1, since the ceramic does not include the sintering additive, it can be used even in temperature environments of 1300° C. or higher and in acid-base atmospheres.

Note that, the substrate fixing device 1 can be shipped as a finished product. In this case, the electrostatic chuck 30 shown in FIG. 3A may be shipped as a finished product. In this case, a person who purchased the electrostatic chuck 30 can obtain the substrate fixing device 1 by executing the processes shown in FIGS. 3B and 3C, as required.

Further, the substrate fixing device 1 may not have the control unit. Specifically, the control unit configured to calculate a temperature of the base body 31 based on the thermal electromotive force obtained from the thermocouple 34 and to control a voltage that is to be applied to the heat-generating element 33 may be provided separately from the substrate fixing device 1. In this case, the end portions (the other end of the first wire part 343 and the other end of the second wire part 344) of the first wire part 343 and the second wire part 344 on the sides not bonded to the first conductor part 341 and the second conductor part 342 protrude from the other surface 10b of the base plate 10. The end portions of the first wire part 343 and the second wire part 344 protruding from the other surface 10b of the base plate 10 can be electrically connected to the control unit at necessary positions, as required.

Second Embodiment

In a second embodiment, an example of a thermoelectric component having a ceramic substrate and a thermoelectric device is described. Note that, in the second embodiment, the descriptions of the same constitutional components as those in the above-described embodiment may be omitted.

Figure 4A:
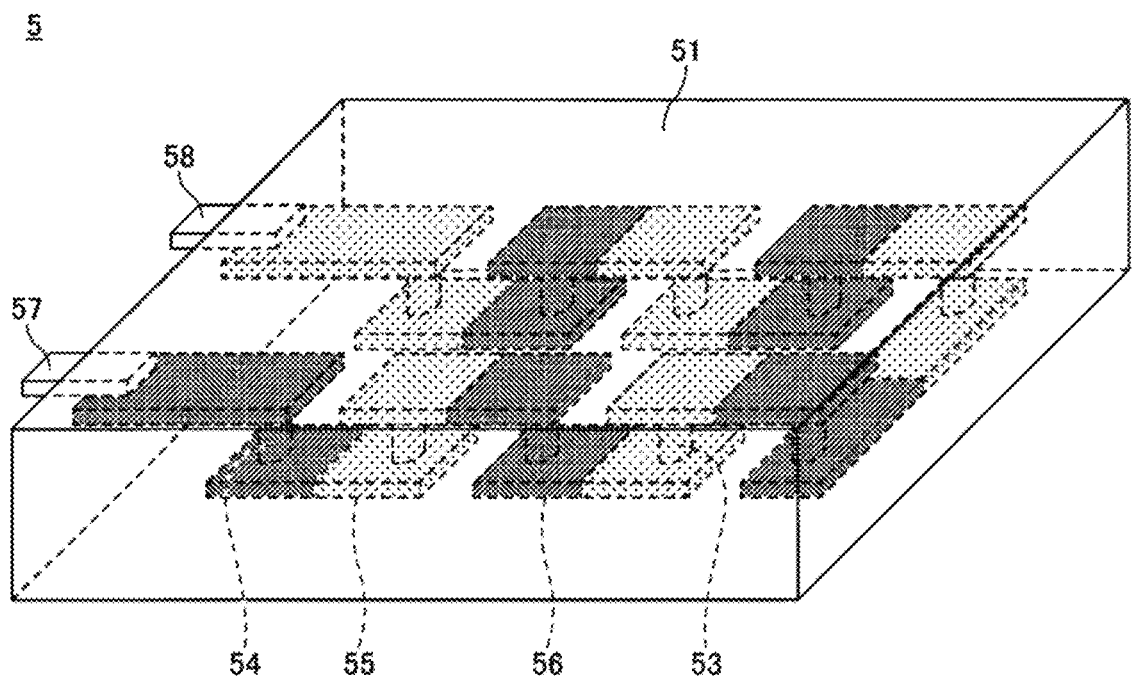
FIGS. 4A and 4B show a thermoelectric component according to a second embodiment.
Figure 4B:
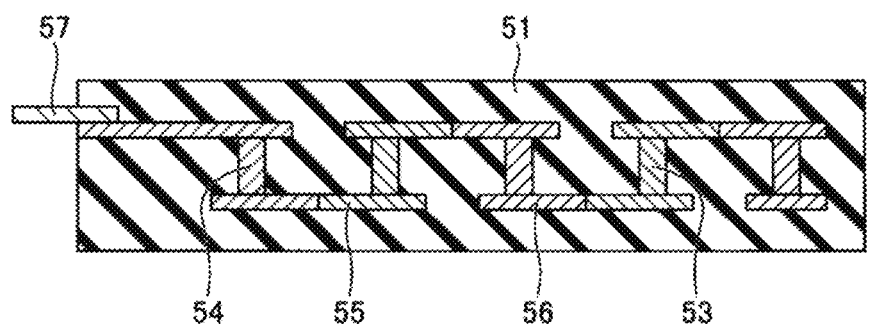

FIG. 4A is a view showing a thermoelectric component according to a second embodiment, where FIG. 4A is a perspective view and FIG. 4B is a sectional view. As shown in FIG. 4A, a thermoelectric component 5 is a ceramic structure having a ceramic substrate 51 that is to be a base body, a first conductor layer and a second conductor layer arranged in different positions in a thickness direction of the ceramic substrate 51, and vias 53 and 54 for electrically connecting the first conductor layer and the second conductor layer.

The ceramic substrate 51 can be manufactured by sintering a plurality of (for example, three) green sheets. The first conductor layer and the second conductor layer in the ceramic substrate 51 are formed with a plurality of thermocouple +legs 55 (first conductor parts) and a plurality of thermocouple −legs 56 (second conductor parts).

The plurality of thermocouple +legs 55 and the plurality of thermocouple −legs 56 are alternately arranged adjacent to each other. In the first conductor layer and the second conductor layer, the thermocouple +leg 55 and the thermocouple −leg 56 are bonded and electrically connected. For example, in the first conductor layer, an external electrode terminal 57 is provided on one end-side of a plurality of thermocouple device pairs connected in series and an external electrode terminal 57 is provided on the other end-side. Note that, for convenience, in FIG. 4A, the plurality of thermocouple +legs 55 and the plurality of thermocouple −legs 56 are shown in different satin patterns. The via 53 is formed of the same material as the thermocouple +leg 55, and the via 54 is formed of the same material as the thermocouple −leg 56.

The ceramic substrate 51 is a ceramic made of aluminum oxide ($Al_2O_3$). The ceramic substrate 51 preferably has an aluminum oxide purity of 99.5% or higher. The ceramic substrate 51 preferably has a relative density of 97% or greater with respect to aluminum oxide. The ceramic substrate 51 preferably has an average particle diameter of aluminum oxide of 1.0 μm or greater and 3.0 μm or smaller.

The thermocouple +leg 55 is, for example, a sintered body having an alloy (Re: 5 wt %) of tungsten (W) and rhenium (Re), as a main component, and includes nickel oxide (NiO), aluminum oxide ($Al_2O_3$) and silicon dioxide ($SiO_2$). The thermocouple −leg 56 is, for example, a sintered body having an alloy (Re: 26 wt %) of tungsten (W) and rhenium (Re), as a main component, and includes nickel oxide (NiO), aluminum oxide ($Al_2O_3$) and silicon dioxide ($SiO_2$). The preferable average particle diameter and preferable addition amount of each component are similar to those of the first conductor part 341 and the second conductor part 342.

In the thermoelectric component 5, when an upper surface-side of the ceramic substrate 51 is set to high temperatures and a lower surface-side of the ceramic substrate 51 is set to low temperatures, the thermal electromotive force is generated in the thermoelectric component 5, so that the current can be taken out from between the external electrode terminal 57 and the external electrode terminal 58.

In this way, when nickel oxide is added to the thermocouple +leg 55 and the thermocouple −leg 56, the sinterability of tungsten and rhenium in the conductive body constituting each leg of the thermocouple is improved without considerably lowering the electromotive force of the thermocouple.

Further, when aluminum oxide and silicon dioxide are added to the thermocouple +leg 55 and the thermocouple −leg 56, the adhesiveness between the ceramic constituting the ceramic substrate 51, which is to be the base body, and tungsten and rhenium, specifically, the adhesiveness between the base body and each leg of the thermocouple is improved. Therefore, since it is not necessary to use the sintering additive, it is possible to reduce the concern that characteristics of the ceramic constituting the base body will be deteriorated. The other effects are also similar to those of the first embodiment.

In the below, the ceramic structure is more specifically described with reference to Examples and Comparative Examples. However, the present invention is not limited to the Examples.

A green sheet where the ceramic material is aluminum oxide and a sintering additive is included was prepared. A conductive paste (for the +leg), which has an alloy (Re: 5 wt %) of tungsten (W) and rhenium (Re), as a main component, and includes nickel oxide powders added by 0.5 wt % with respect to an amount of tungsten powders, was printed on a surface of the green sheet. Further, a conductive paste (for the −leg), which has an alloy (Re: 26 wt %) of tungsten (W) and rhenium (Re), as a main component, and includes nickel oxide powders added by 0.5 wt % with respect to an amount of tungsten powders, was printed. Then, the green sheet and the two types of the conductive pastes were co-sintered under atmospheric pressure, so that a sample 300A of thermocouples having a pattern shown in FIG. 5 was manufactured.

Similarly, a green sheet where the ceramic material is aluminum oxide and a sintering additive is included was prepared. A conductive paste (for the +leg), which has an alloy (Re: 5 wt %) of tungsten (W) and rhenium (Re), as a main component, was printed on a surface of the green sheet. Further, a conductive paste (for the −leg), which has an alloy (Re: 26 wt %) of tungsten (W) and rhenium (Re), as a main component, was printed. Then, the green sheet and the two types of the conductive pastes were co-sintered under atmospheric pressure, so that a sample 300B of thermocouples having a pattern shown in FIG. 5 was manufactured.

Figure 5:
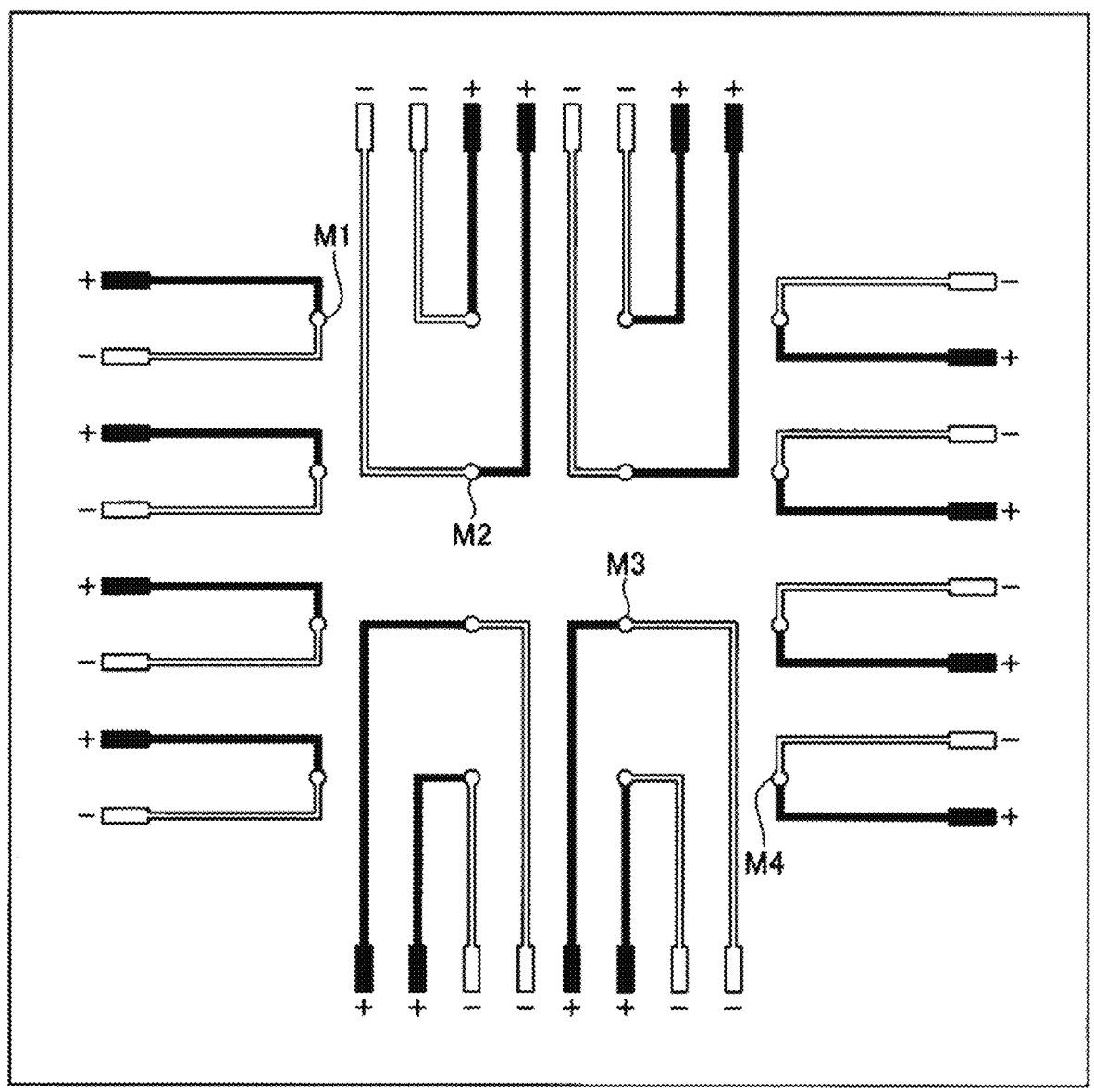
FIG. 5 shows a pattern of a sample of a thermocouple.
Figure 6A:
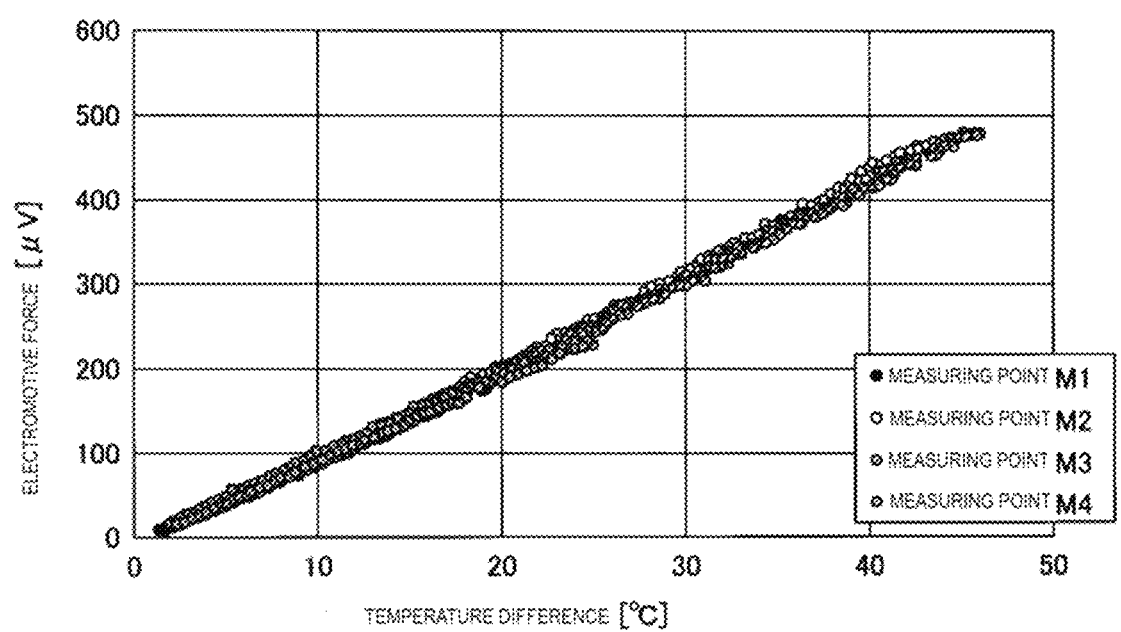
FIGS. 6A and 6B show electromotive force of each sample of the thermocouple.
Figure 6B:
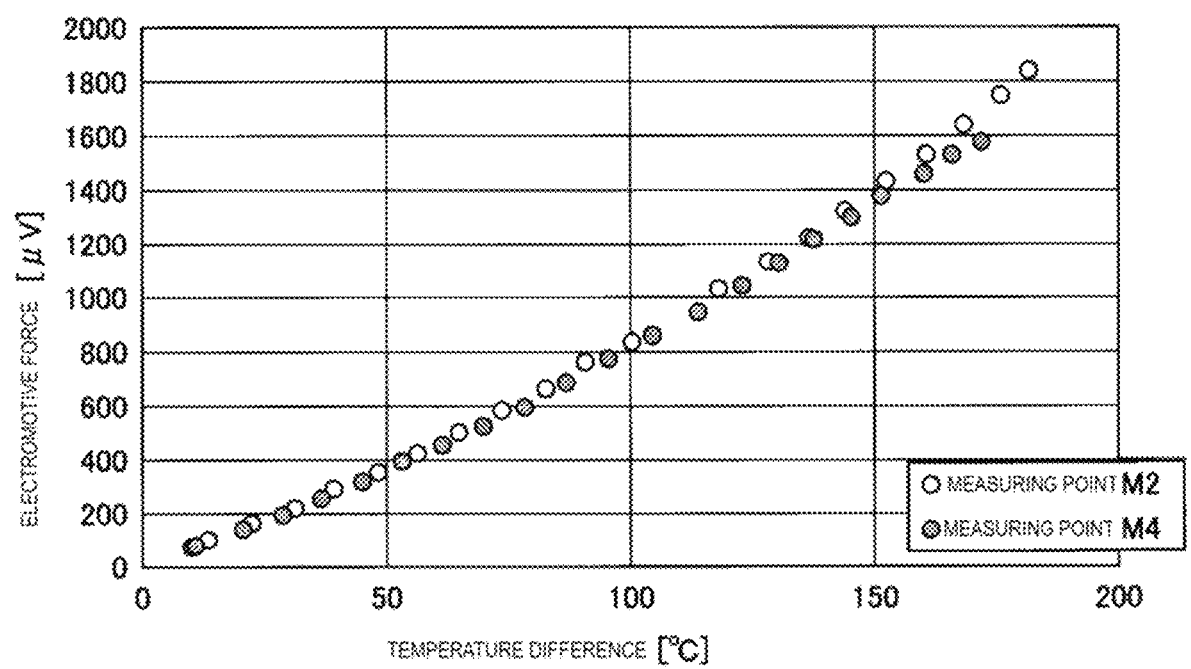

Then, M1 to M4 shown in FIG. 5 were set as measuring points, and the electromotive force at each measuring point was measured for each of the samples 300A and 300B. FIG. 6A shows a measurement result on the sample 300A, and FIG. 6B shows a measurement result on the sample 300B. As shown in FIG. 6A, for the sample 300A, the electromotive force was about 10.2 μV/° C. on average, and as shown in FIG. 6B, for the sample 300B, the electromotive force was about 9.9 μV/° C. on average. From these results, it can be seen that even when nickel oxide is added to the alloy of tungsten (W) and rhenium (Re), the sufficient electromotive force is generated.

A green sheet where the ceramic material is aluminum oxide and no sintering additive is included was prepared. A conductive paste, in which nickel oxide powders were added by 0.5 wt %, aluminum oxide powders were added by 2.0 wt % and silicon dioxide powders were added by 2.0 wt % with respect to an amount of tungsten powders, was printed on a surface of the green sheet, which were then co-sintered under atmospheric pressure. Thereby, a sample 300C of Example was manufactured.

Figure 7:
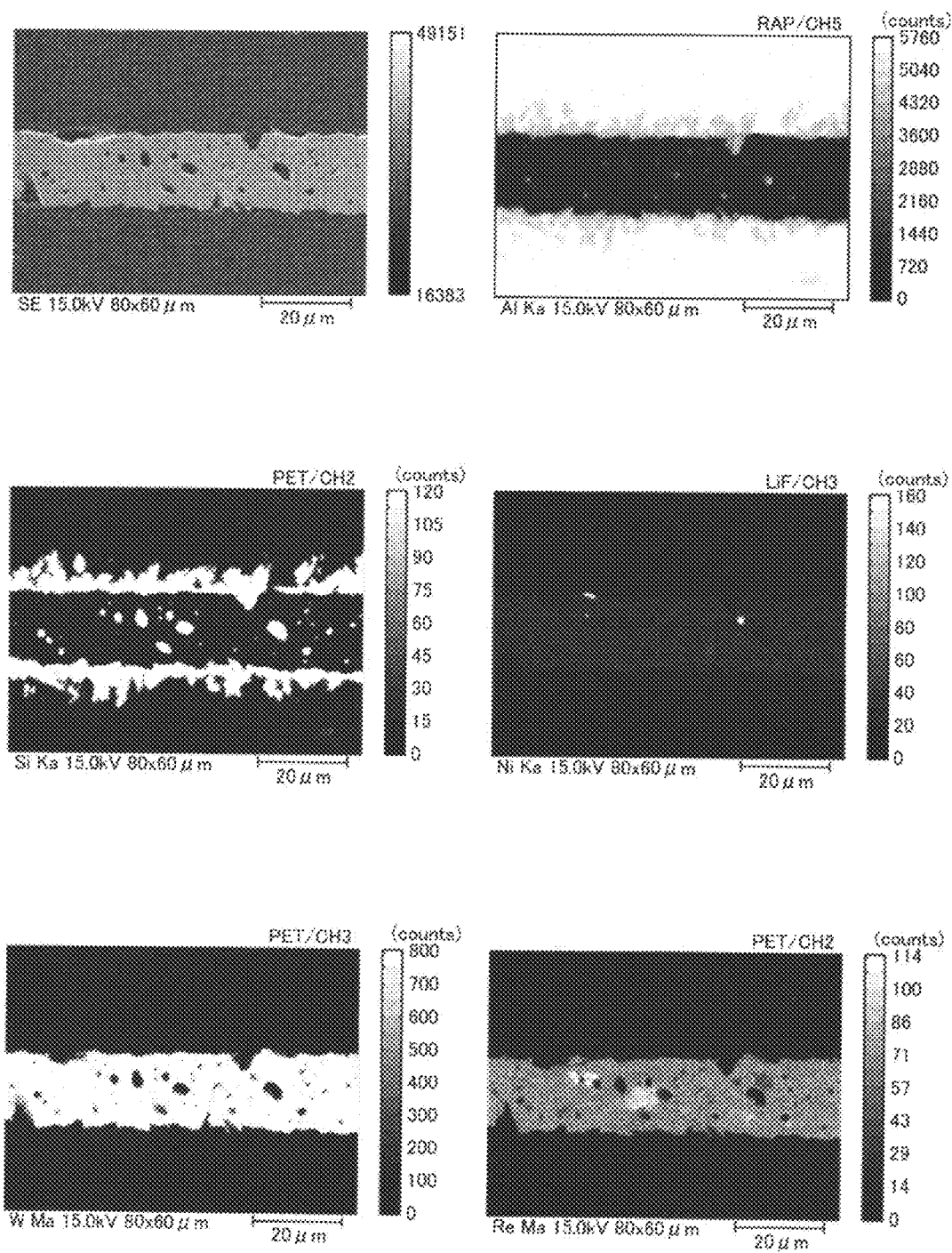
FIG. 7 shows an EPMA analysis result on a section of a +leg of a sample 300C.
Figure 8:
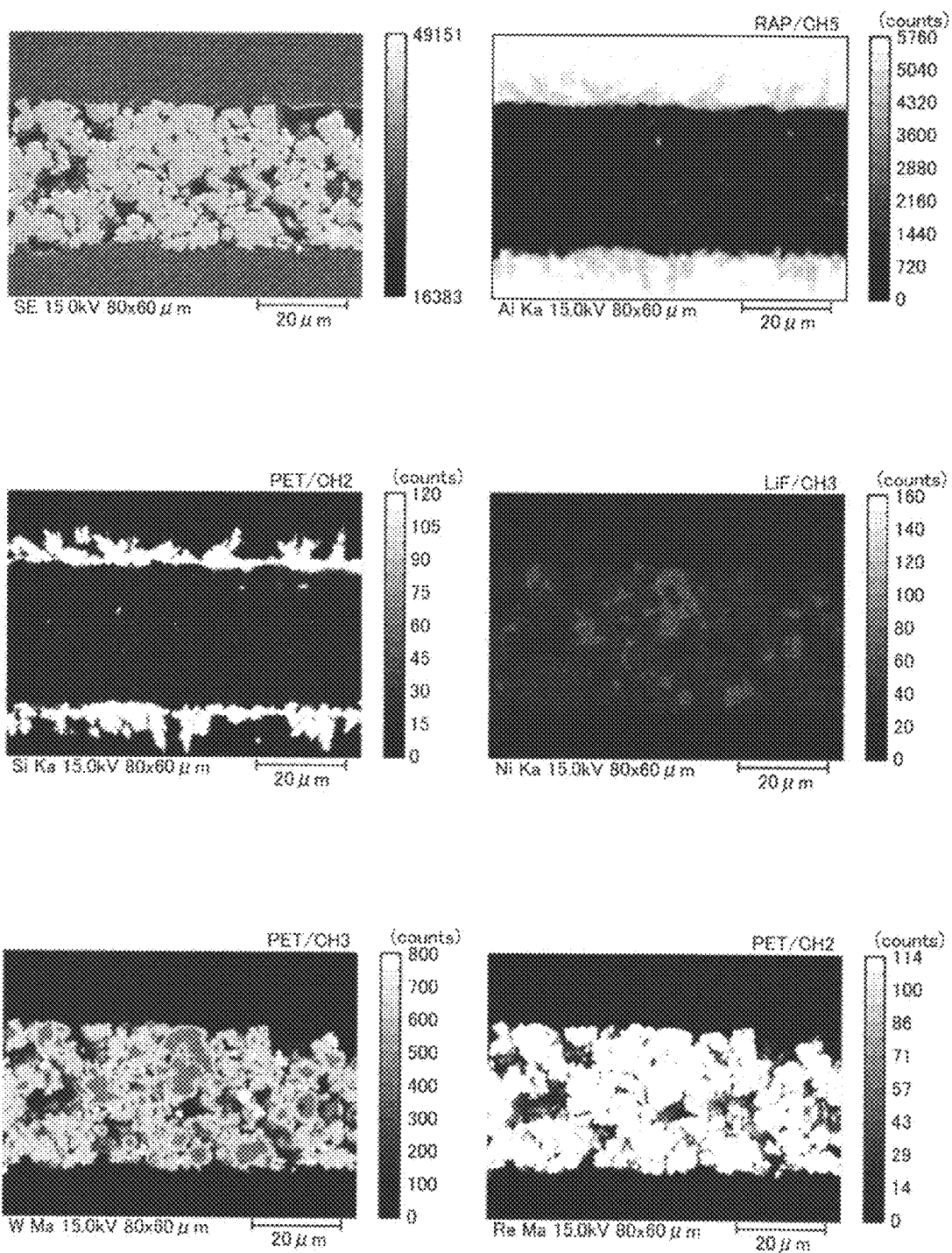
FIG. 8 shows an EPMA analysis result on a section of a −leg of the sample 300C.

FIG. 7 shows an EPMA analysis result on a section of the +leg of the sample 300C. FIG. 8 shows an EPMA analysis result on a section of the −leg of the sample 300C. From FIGS. 7 and 8, it was confirmed that, in the sample 300C, the Si component was present both in the conductive body (the conductive paste after sintering) and in the ceramic (the green sheet after sintering), and particularly, was present only near the boundary (within the range of 20 μm toward the ceramic, including the boundary) in the ceramic.

Since the Si component is present only within the range of 20 μm toward the ceramic, including the boundary, and does not diffuse beyond the range, it is possible to reduce the concern that characteristics of the ceramic will be deteriorated.

Figure 9A:
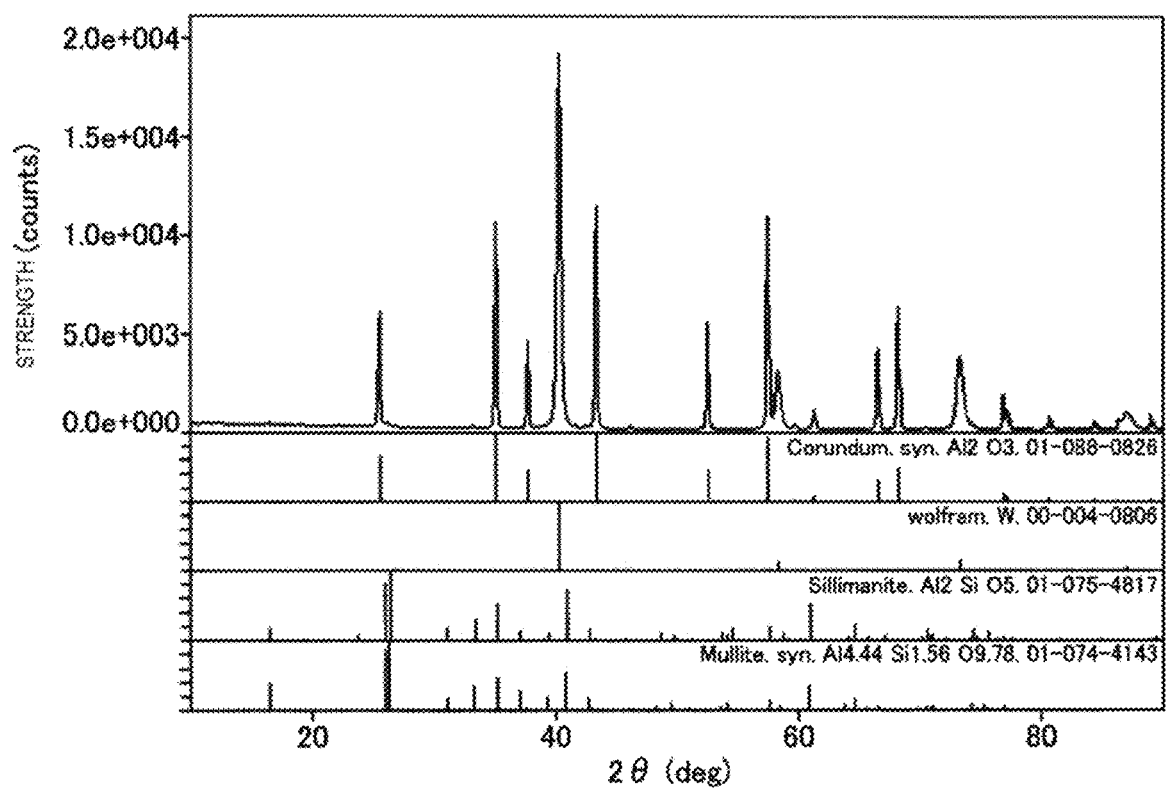
FIGS. 9A and 9B show XRD analysis results on the +leg and the −leg of the sample 300C.
Figure 9B:
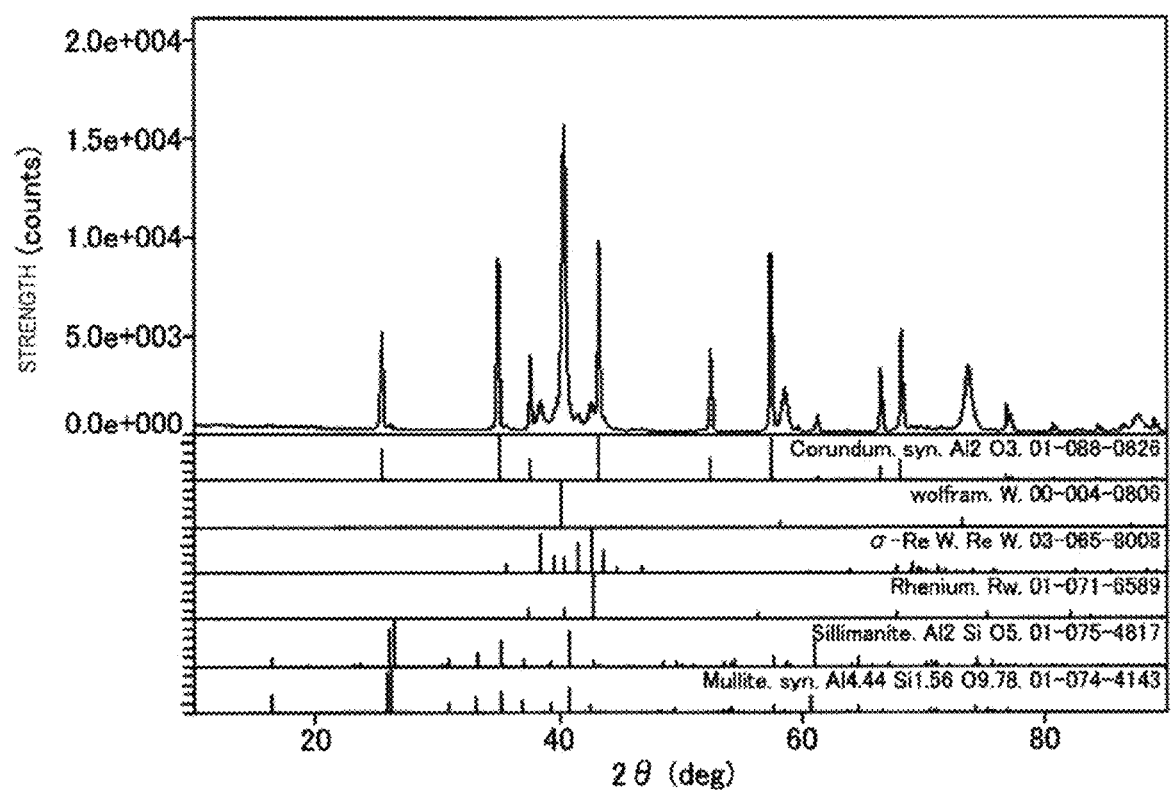

Then, the conductive body (the conductive paste after sintering) of the sample 300C was scraped from the surface, and the XRD analysis was performed on a part at which the ceramic was exposed. The results are shown in FIGS. 9A and 9B. FIG. 9A shows data of the +leg, and FIG. 9B shows data of the −leg. From FIGS. 9A and 9B, it was confirmed that a crystal phase, in which mullite or sillimanite was present or both were mixed, was formed in the part of the sample 300C, at which the ceramic was exposed.

The Si component of silica added to the conductive paste is divided into Si component that remains in the conductive body after sintering and Si component that diffuses toward the ceramic. Since the Si component diffusing from the conductive body toward the ceramic is consumed to form a composite oxide layer of Al and Si near the boundary between the conductive body and the ceramic, the Si component does not diffuse into the ceramic. It is thought that the composite oxide layer of Al and Si formed near the boundary between the conductive body and the ceramic considerably contributes to improvement on the adhesiveness between the conductive body and the ceramic.

A chemical formula of mullite is $3Al_2O_3/2SiO_2$ ($Al_6Si_2O_{13}$), and a chemical formula of sillimanite is $Al_2O_3/SiO_2$ ($Al_2SiO_5$). A range of the composite oxide layer of Al and Si can be controlled to some extent by the addition amounts of alumina and silica that are added to the conductive paste.

Although the preferred embodiments have been described in detail, the present invention is not limited to the above embodiments and the above embodiments can be diversely modified and replaced without departing from the scope of the claims.

For example, as the suction target of the substrate fixing device of the present invention, a glass substrate and the like that are used in a manufacturing process of a liquid crystal panel and the like may be exemplified, in addition to the wafer (silicon wafer, and the like).

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A ceramic structure comprising:
   a base body; and
   a thermoelectric device having a part in directly contact with the base body,
   wherein the base body is a ceramic consisting of aluminum oxide, and
   wherein the thermoelectric device comprises a conductor part that is a sintered body having an alloy of tungsten and rhenium, as a main component, and including nickel oxide, aluminum oxide and silicon dioxide.

2. The ceramic structure according to claim 1, wherein the conductor part has an addition amount of nickel oxide of 0.2 to 1.0 wt % with respect to tungsten.

3. The ceramic structure according to claim 1, wherein the conductor part has an addition amount of aluminum oxide of 0.2 to 3.0 wt % and an addition amount of silicon dioxide of 0.2 to 3.0 wt % with respect to tungsten.

4. The ceramic structure according to claim 1, wherein an average particle diameter of tungsten included in the conductor part is 0.5 μm to 3.0 μm, an average particle diameter of rhenium is 1.5 m to 4.5 μm, an average particle diameter of nickel oxide is 5.0 μm to 15.0 μm, an average particle diameter of aluminum oxide is 0.1 μm to 4.0 μm, and an average particle diameter of silicon dioxide is 0.1 μm to 12.0 μm.

5. The ceramic structure according to claim 1, wherein a component of tungsten, a component of rhenium and a component of nickel are not present in the base body and are present only in the conductor part, and a component of aluminum and a component of silicon are present both in the base body and in the conductor part.

6. The ceramic structure according to claim 5, wherein the component of silicon in the base body is present only within a range of 20 μm from a boundary between the base body and the conductor part.

7. The ceramic structure according to claim 6, wherein a composite oxide layer of aluminum and silicon is formed within the range of 20 μm from the boundary between the base body and the conductor part.

8. The ceramic structure according to claim 7, wherein the composite oxide layer is a mullite layer, a sillimanite layer or a mixed layer of the mullite and the sillimanite layer.

9. The ceramic structure according to claim 1, wherein the base body has an aluminum oxide purity of 99.5% or higher.

10. The ceramic structure according to claim 1, wherein the base body has a relative density of 97% or higher with respect to aluminum oxide.

11. The ceramic structure according to claim 1, wherein the base body has an average particle diameter of aluminum oxide ranging from 1.0 μm to 3.0 μm.

12. The ceramic structure according to claim 1, wherein the conductor part comprises a first conductor part and a second conductor part, wherein the thermoelectric device is a thermocouple where one ends of the first conductor part and the second conductor part are bonded to form a temperature measurement contact point, wherein the first conductor part is a sintered body that has an alloy (Re: 5 wt %) of tungsten and rhenium, as a main component, and includes nickel oxide, aluminum oxide and silicon dioxide, and wherein the second conductor part a sintered body that has an alloy (Re: 26 wt %) of tungsten and rhenium, as a main component, and includes nickel oxide, aluminum oxide and silicon dioxide.

13. The ceramic structure according to claim 12, wherein the first conductor part and the second conductor part are each provided in plural, and the first conductor parts and the second conductor parts are alternately arranged adjacent to each other.

14. An electrostatic chuck comprising:
the ceramic structure according to claim 1; and
an electrostatic electrode embedded in the base body.

15. A substrate fixing device comprising:
a base plate; and
the electrostatic chuck according to claim 14 mounted on one surface of the base plate.

* * * * *